United States Patent
Matsumoto et al.

(10) Patent No.: US 9,589,902 B2
(45) Date of Patent: Mar. 7, 2017

(54) SEMICONDUCTOR WAFER

(71) Applicant: SEIKO INSTRUMENTS INC., Chiba-shi, Chiba (JP)

(72) Inventors: Yasunobu Matsumoto, Chiba (JP); Masaki Suzuki, Chiba (JP); Makoto Asou, Chiba (JP); Hiroshi Morita, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/672,811

(22) Filed: Mar. 30, 2015

(65) Prior Publication Data

US 2015/0279786 A1  Oct. 1, 2015

(30) Foreign Application Priority Data

Apr. 1, 2014 (JP) ................. 2014-075029

(51) Int. Cl.
*H01L 23/544* (2006.01)
*H01L 25/18* (2006.01)

(52) U.S. Cl.
CPC ............ *H01L 23/544* (2013.01); *H01L 25/18* (2013.01); *H01L 2223/5442* (2013.01); *H01L 2223/5444* (2013.01); *H01L 2223/54426* (2013.01); *H01L 2223/54433* (2013.01); *H01L 2223/54466* (2013.01); *H01L 2223/54493* (2013.01); *H01L 2924/0002* (2013.01)

(58) Field of Classification Search
CPC .................................................. H01L 23/544
See application file for complete search history.

(56) References Cited

U.S. PATENT DOCUMENTS

| | | | |
|---|---|---|---|
| 6,218,726 B1* | 4/2001 | Chang | H01L 22/34 257/203 |
| 6,948,105 B2* | 9/2005 | Rajsuman | G01R 31/31704 257/672 |
| 8,884,403 B2* | 11/2014 | Co | H01L 21/6836 257/620 |
| 9,204,543 B2* | 12/2015 | Ossimitz | H01L 23/49838 |
| 2003/0015792 A1* | 1/2003 | Urakawa | G11C 5/04 257/724 |
| 2005/0208684 A1* | 9/2005 | Yamada | H01L 22/20 438/14 |
| 2008/0036485 A1* | 2/2008 | Nagai | H01L 22/20 324/750.18 |
| 2012/0126844 A1* | 5/2012 | Yasuta | G01R 31/2893 324/756.07 |
| 2013/0078745 A1* | 3/2013 | Wang | H01L 22/14 438/15 |
| 2015/0228622 A1* | 8/2015 | Koyanagi | H01L 23/49838 257/777 |

OTHER PUBLICATIONS

Patent Abstracts of Japan, Publication No. 05-013570, Publication Date Jan. 22, 1993.

* cited by examiner

*Primary Examiner* — Eugene Lee
(74) *Attorney, Agent, or Firm* — Adams & Wilks

(57) ABSTRACT

A semiconductor wafer has formed thereon various types of semiconductor chips and enables different types of semiconductor chips having the same chip size to be easily distinguished. An excluded region is formed on an outer periphery of the semiconductor wafer, and a region inside the excluded region is divided into different types of regions by boundaries. Mark chips are respectively arranged in the vicinity of both ends of the boundaries.

5 Claims, 3 Drawing Sheets

SEMICONDUCTOR WAFER

BACKGROUND OF THE INVENTION

1. Field of the Invention

The present invention relates to a semiconductor wafer, in particular, to a semiconductor wafer on which more than two types of semiconductor chips are formed.

2. Description of the Related Art

Heretofore one type of semiconductor chip has been, in general, formed on one semiconductor wafer. Since a yield from the one wafer has been dramatically improved along with an increase in diameter of the semiconductor wafer, 20,000 or more of the semiconductor chips can be manufactured when a semiconductor chip having an area of 1 mm2 is formed on an 8-inch semiconductor wafer. If the number of semiconductor chips required for production is less than 10,000, the remaining semiconductor chips may become unnecessary stock, with the result that the benefit of the semiconductor wafer having the larger diameter may not be realized. In order to solve this problem, a measure is taken in which a plurality of types of semiconductor chips is formed on one semiconductor wafer.

In Japanese Published Patent Application JP 5-13570, there is disclosed a method of manufacturing a semiconductor wafer, in which different types of semiconductor chips having different chip sizes are divided by a use of scribe lines having different intervals therebetween.

When the different types of semiconductor chips having the different chip sizes are formed as described above, it is easy to distinguish the semiconductor chips. However, it is difficult to find boundaries between the different types of semiconductor chips through visual and microscopic inspections in the appearance test process when different types of semiconductor chips have the same chip size. Moreover, a reference point for each of the different types of semiconductor chips is unclear, and hence the operations in a probing test process, for example, sometimes have troubles.

SUMMARY OF THE INVENTION

It is an object of the present invention to provide a semiconductor wafer that enables different types of semiconductor chips having the same chip size to be easily distinguished.

In order to solve the above-mentioned problem, one embodiment of the present invention takes the following measures.

First, a semiconductor wafer includes: an excluded region formed on an outer periphery of the semiconductor wafer; a plurality of types of semiconductor chip regions formed on an inner side of the excluded region; a reference point chip arranged at an upper end of each of the plurality of types of semiconductor chip regions so as to be adjacent to the excluded region; and a mark chip adjacent to the reference point chip.

Further, in the semiconductor wafer, the mark chip is arranged at each side of the upper end of the each of the plurality of semiconductor chip regions.

Further, in the semiconductor wafer, the mark chip includes type distinction information and address information allowing a lot number, a wafer number, and a position on a wafer of the semiconductor chip to be distinguished.

Further, in the semiconductor wafer, the mark chip has a surface on which one of a distinguishable character and a distinguishable symbol is marked.

Further, in the semiconductor wafer, the mark chip includes a plurality of fuses, and a part of the plurality of fuses is cut.

With the use of the above-mentioned measures, it is possible to easily distinguish the different types of semiconductor chips formed on the semiconductor wafer in an appearance test process and a probing test process. Moreover, it is possible to easily track the lot number, the wafer number, and the position on a wafer even after the wafer is divided at the boundaries of the different types of semiconductor chips.

DETAILED DESCRIPTION OF THE INVENTION

A semiconductor wafer according to each of embodiments of the present invention is now described with reference to the drawings.

First Embodiment

Figure 1:
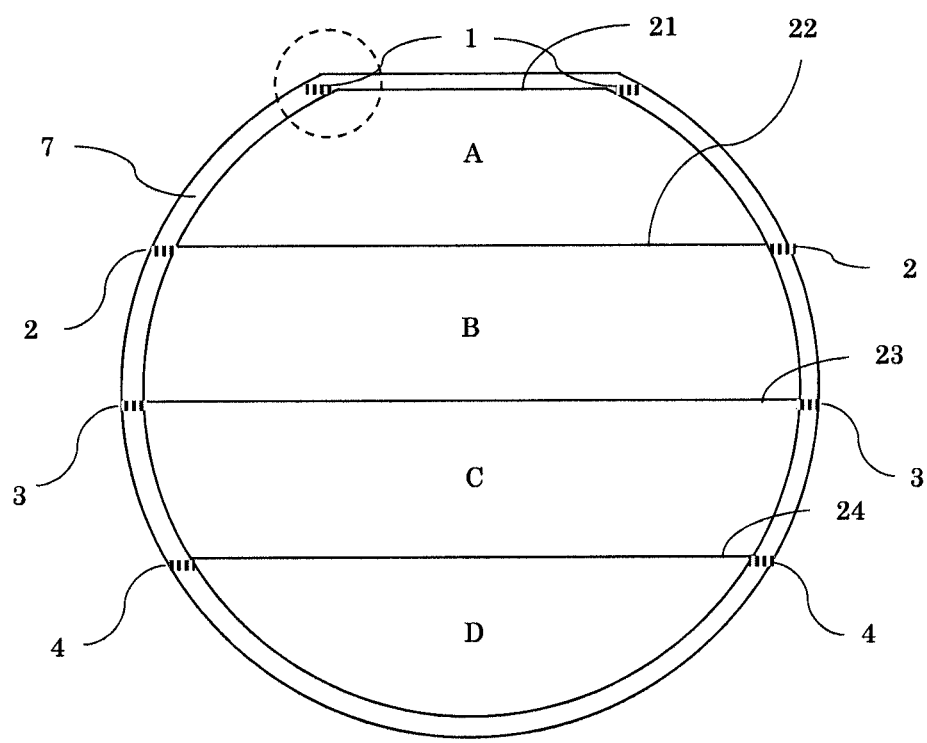
FIG. 1 is a diagram illustrating a semiconductor wafer according to a first embodiment of the present invention.

FIG. 1 is a diagram illustrating a semiconductor wafer according to a first embodiment of the present invention. One semiconductor wafer is divided into semiconductor chip regions A, B, C, and D so that different types of semiconductor chips are formed. The semiconductor chip regions A, B, C, and D are defined by boundaries 22, 23, and 24 that are scribe lines having the same width, and are no different than scribe lines in each of the semiconductor chip regions. The boundary 21 is a boundary between the semiconductor chip region A and the excluded region 7 on an orientation flat side. Mark chips 1, 2, 3, and 4 are arranged in the vicinity of the left ends of the boundaries 21, 22, 23, and 24.

Figure 2:
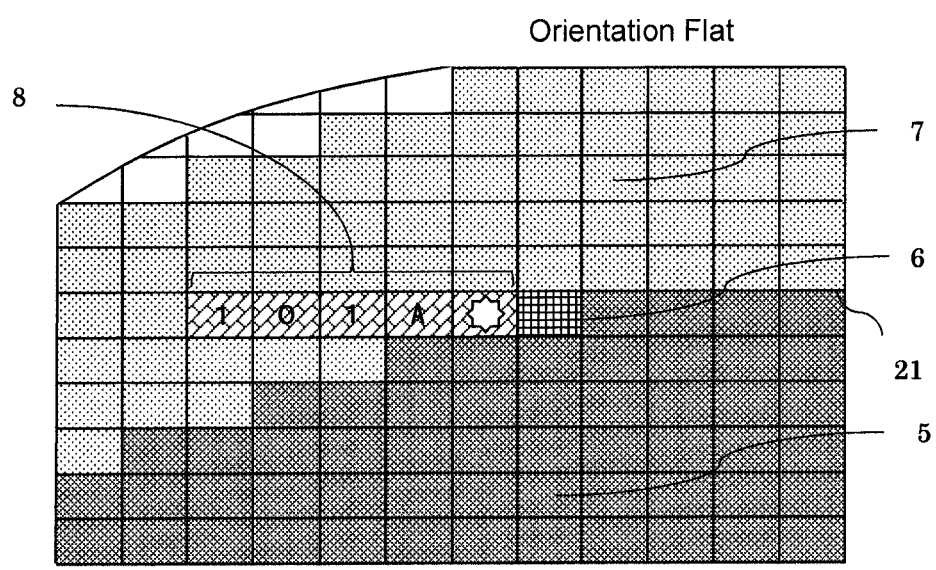
FIG. 2 is an enlarged view of a region circled in FIG. 1.

FIG. 2 is an enlarged view of a region circled in FIG. 1.

Semiconductor chips having the same chip size are assigned on an entire surface of the semiconductor wafer. Further, an outer periphery of the semiconductor wafer and a portion of the semiconductor wafer near the orientation flat are regarded as an excluded region 7. The semiconductor chips assigned on the excluded region 7 are not measured even if the appearances of the semiconductor chips are normal. Such an excluded region is formed because the outer periphery of the semiconductor wafer and the portion of the semiconductor wafer near the orientation flat may not be processed normally due to, for example, a clamp of a semiconductor manufacturing apparatus being brought into contact therewith. The boundary 21 extending in an X axis direction defines the excluded region 7 and the semiconductor chip region A in the X axis direction, and overlaps with the scribe line defining the semiconductor chips. A semiconductor chip arranged at the upper left end of the semiconductor chip region A is a reference point chip 6, and a mark chip 8 is arranged on a left side of the reference point chip 6.

The mark chip 8 is a chip arranged in the region that belongs to the excluded region 7 and thus is not to be measured. As illustrated in FIG. 2, the mark chip consists of, for example, five chips. Each of the mark chips has a surface on which a visually recognizable distinction mark, such as an alphanumeric character or a symbol, is marked for distinguishing the types of semiconductor chips. The distinction mark is marked with use of a mask and a laser. With this configuration, the character or the symbol marked on the surface of the mark chip is read so that the type of semiconductor chip 5 assigned in the semiconductor chip region A can be distinguished from the reference point chip 6 in the appearance test process and the probing test process.

As illustrated in FIG. 1, the mark chips can be arranged on both sides of each of the boundaries, and the mark chip 8 may be arranged on the right end of the excluded region 7 in this case.

Second Embodiment

Figure 3:
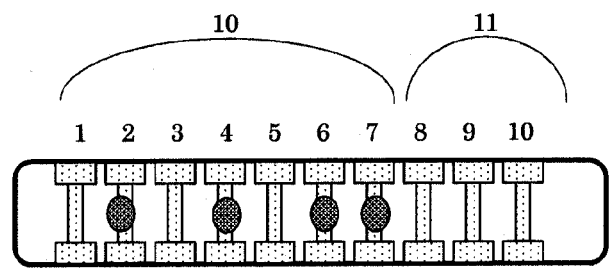
FIG. 3 is a diagram illustrating a semiconductor wafer according to a second embodiment of the present invention.

FIG. 3 is a diagram illustrating a semiconductor wafer according to a second embodiment of the present invention, in which an example of a distinction mark in binary that uses presence and absence of a cut in a fuse, which is included in the mark chip, is shown. In FIG. 3, ten fuses are arranged in a fuse region. All of the fuses may be assigned to a product code, or the fuses may be divided for the product code 10 and a region code 11 as illustrated in FIG. 3. The product code 10 includes information for distinguishing the types of semiconductor chips, and the region code 11 includes address information for distinguishing a lot number, a wafer number, and a position on a wafer of the semiconductor chip. In general, in a case where a plurality of types of semiconductor chips are formed on one wafer, the lot number, the wafer number, and the position on a wafer of the semiconductor chip are lost when the wafer is cut into wafer pieces for each type of semiconductor chip. The region code 11 has a role of enabling the tracking of the lot number, the wafer number, and the position on a wafer even after the wafer is cut into the wafer pieces. It is important even for the mark chip as illustrated in FIG. 2 to include the information on the lot number, the wafer number, and the position on a wafer in addition to the type information. In such a case, devices of marking a plurality of characters or symbols on one chip and the like are required in order to avoid an increase in region occupied by the mark chip.

Third Embodiment

Figure 4:
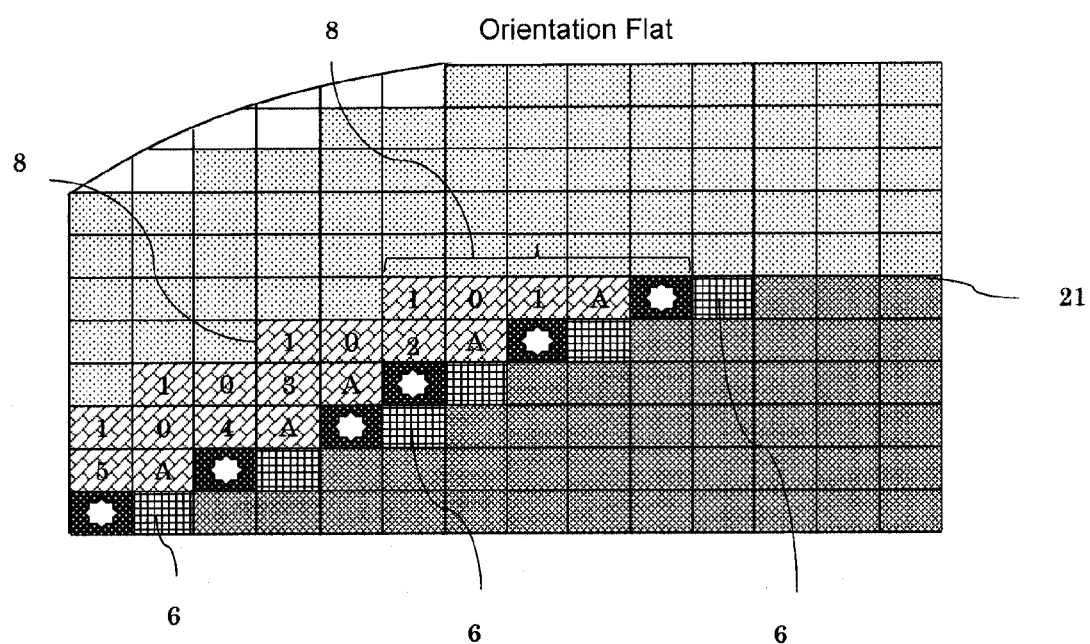
FIG. 4 is a diagram illustrating a semiconductor wafer according to a third embodiment of the present invention.

FIG. 4 is a diagram illustrating a semiconductor wafer according to a third embodiment of the present invention.

FIG. 4 differs from FIG. 2 in that the mark chips 8 are arranged on all of the rows. The mark chips 8 are respectively marked with successive numbers including 101A, 102A, and 103A instead of the numbers for each type. Among the semiconductor chips formed on the semiconductor wafer, some of the semiconductor chips become the different types of semiconductor chips by being processed in the completely same process until the middle of the processes, and then subjected to different processes from the middle of a certain process. The arrangement of the mark chips of FIG. 4 is effective for the case where the types of semiconductor chips and the number of the semiconductor chips are not fixed at the start of the processes, and the semiconductor chips become the different types of semiconductor chips in the later process as in the case described above.

When the types of semiconductor chips and the number of the semiconductor chips are determined, the plurality of types of semiconductor chips is formed on the semiconductor wafer with use of the reference point chip 6. Then, the number or the symbol of the mark chip 8 is read, which is arranged to be adjacent to the reference point chip 6 for each type of semiconductor chip at this time. The read information is shared in next process and subsequent processes so that which reference point chip corresponds to each type of semiconductor chip can be easily known. For example, in the subsequent processes of the appearance test process and the probing test process, the reference point chip corresponding to each type of semiconductor chip is easily found based on the information read previously. Consequently, the time taken for the operations can be reduced.

With reference to FIG. 4, the mark chip 8 is described as an example, which has the surface on which a visually recognizable distinction mark such as an alphanumeric character or a symbol is marked. However, in place of this, the embodiments of FIG. 3 and FIG. 4 may be combined so that a mark chip including a fuse may be arranged on the outer periphery of the semiconductor wafer.

The present invention is applicable to manufacturing of an electronic component, which can involve assignment of a plurality of products on one substrate, to thereby cope with high-mix low-volume production.

What is claimed is:

1. A semiconductor wafer, comprising:
   an excluded region formed on an outer periphery of the semiconductor wafer;
   a plurality of semiconductor chip regions formed on an inner side of the excluded region, the plurality of semiconductor chip regions comprising different types of semiconductor chip regions;
   a plurality of semiconductor chips having the same size arranged in each of the plurality of semiconductor chip regions;
   a reference point chip arranged at an upper end of each of the plurality of semiconductor chip regions so as to be adjacent to the excluded region when an orientation flat side of the semiconductor wafer corresponds to an upper side of the semiconductor wafer, the reference point chip having a size the same as the size of the semiconductor chip; and
   a mark chip adjacent to the reference point chip on the excluded region side of each of the plurality of semiconductor chip regions.

2. A semiconductor wafer according to claim 1, wherein the mark chip is arranged at each side of the upper end of each of the plurality of semiconductor chip regions.

3. A semiconductor wafer according to claim 1, wherein the mark chip comprises type distinction information and address information allowing a lot number, a wafer number, and a position on a wafer of the semiconductor chip to be distinguished.

4. A semiconductor wafer according to claim 3, wherein the mark chip has a surface on which one of a distinguishable character and a distinguishable symbol is marked.

5. A semiconductor wafer according to claim 3;
   wherein the mark chip comprises a plurality of fuses, and
   wherein a part of the plurality of fuses is cut, to thereby write the type distinction information and the address information.

* * * * *